(12) United States Patent
Anders

(10) Patent No.: US 8,574,410 B2
(45) Date of Patent: Nov. 5, 2013

(54) METHOD AND APPARATUS FOR IMPROVED HIGH POWER IMPULSE MAGNETRON SPUTTERING

(75) Inventor: Andre Anders, El Cerrito, CA (US)

(73) Assignee: The Regents of the University of California, Oakland, CA (US)

( * ) Notice: Subject to any disclaimer, the term of this patent is extended or adjusted under 35 U.S.C. 154(b) by 399 days.

(21) Appl. No.: 12/989,378

(22) PCT Filed: Feb. 17, 2009

(86) PCT No.: PCT/US2009/034272
§ 371 (c)(1),
(2), (4) Date: Dec. 15, 2010

(87) PCT Pub. No.: WO2009/131737
PCT Pub. Date: Oct. 29, 2009

(65) Prior Publication Data
US 2011/0089024 A1    Apr. 21, 2011

Related U.S. Application Data

(60) Provisional application No. 61/046,921, filed on Apr. 22, 2008.

(51) Int. Cl.
*C23C 14/35* (2006.01)
(52) U.S. Cl.
USPC ............ 204/192.12; 204/298.06; 204/298.08; 204/298.14; 204/298.16; 204/298.19

(58) Field of Classification Search
USPC ............ 204/298.16, 298.11, 298.08, 298.14, 204/192.12
See application file for complete search history.

(56) References Cited

U.S. PATENT DOCUMENTS

| | | | |
|---|---|---|---|
| 5,015,493 A * | 5/1991 | Gruen | 427/571 |
| 6,350,356 B1 * | 2/2002 | Welty | 204/298.12 |
| 2002/0000779 A1 | 1/2002 | Anders et al. | |
| 2004/0094402 A1 * | 5/2004 | Gopalraja et al. | 204/192.12 |
| 2008/0023657 A1 | 1/2008 | Melnychuk et al. | |

OTHER PUBLICATIONS

International Search Report and Written Opinion for International Application No. PCT/US2009/034272, dated Apr. 6, 2009.

* cited by examiner

*Primary Examiner* — Rodney McDonald
(74) *Attorney, Agent, or Firm* — Lawrence Berkeley National Laboratory

(57) ABSTRACT

A high power impulse magnetron sputtering apparatus and method using a vacuum chamber with a magnetron target and a substrate positioned in the vacuum chamber. A field coil being positioned between the magnetron target and substrate, and a pulsed power supply and/or a coil bias power supply connected to the field coil. The pulsed power supply connected to the field coil, and the pulsed power supply outputting power pulse widths of greater that 100 μs.

24 Claims, 4 Drawing Sheets

METHOD AND APPARATUS FOR IMPROVED HIGH POWER IMPULSE MAGNETRON SPUTTERING

RELATED APPLICATIONS

This application claims priority of U.S. Provisional Application No. 61/046,921, entitled "METHOD AND APPARATUS FOR IMPROVED HIGH POWER IMPULSE MAGNETRON SPUTTERING," filed Apr. 22, 2008, the disclosure of which is expressly incorporated herein by reference in its entirety.

STATEMENT REGARDING FEDERALLY SPONSORED RESEARCH OR DEVELOPMENT

This invention was made with government support under contract No. De-AC02-05CH11231 awarded by the United States Department of Energy to the Regents of the University of California for management and operation of the Lawrence Berkeley National Laboratory. The government has certain rights in this invention.

TECHNICAL FIELD

The present disclosure relates generally to sputtering for producing vapor deposition of films, and, more specifically, to High Power Impulse Magnetron Sputtering (HIPIMS) where sputtered material is drawn and directed from a magnetron target by applied fields to substrates.

BACKGROUND

Use of a magnetron with a magnetron target to produce a vapor that can be deposited on a substrate is known and widely used. To use this technique it has been known to position substrates in the vicinity of magnetron targets and to allow sputter produced vapors to expand and hereby contact and be deposited on substrate surfaces. Additionally, bias voltages have been applied to substrates to draw ionized sputtered materials to substrates and thereby control ion energy and resulting surface and film properties.

Use of magnetic fields to control deposition processes also has been utilized. Magnetic fields created adjacent and between magnetron targets and substrates have been used to guide and focus magnetron produced ionized sputter vapors. To be effective in this guiding and focusing, therefore, it is necessary to produce magnetron generated sputter vapors having high ionized fractions. This requirement has necessitated use of pulsed magnetrons such as High Power Impulse Magnetron Sputtering (HIPIMS) systems as opposed to direct current (DC) or radio-frequency (RF) magnetron sputtering which, depending on power level, discharge geometry, magnetron target material and magnetic field geometry typically produce much less than 10% ionization of sputtered material.

A further benefit of HIPIMS systems is the realization of highly ionized vapors without production of target material droplets—such as may be produced by cathodic arc evaporation. As typically operated, HIPIMS systems produce sputter discharge vapors having pulse widths on the order of 100 microseconds ($\mu s$) or less. Accordingly, magnetic fields applied by electric current passing through field coils between magnetron targets and substrates are driven with Direct Current (DC) electric power. A reason why DC electric power is used as opposed to pulsed electric currents that could be increased over DC electric power to produce increased magnetic fields is because of self-inductance effects that decrease the produced magnetic field in time regimes on the order of 100 $\mu s$ magnetron pulses. This consequence of self-inductance has resulted in use of guiding and focusing magnetic field strengths that are produced by applied DC electric power.

SUMMARY

A primary object of the present disclosure is to provide increased guiding and focusing magnetic field strengths to bring ionized magnetron produced target vapors to substrates where they are deposited.

An object of the present disclosure is to provide increased electric field strengths used to direct and focus ionized magnetron produced target vapors.

A further object of the present disclosure is to drive a magnetic field coil with a pulsed power supply having output current pulse widths that are greater than 100 $\mu s$ in duration.

Another object of the present disclosure is to use the same power supply to drive both the magnetron and the magnetic field coil.

Yet another object of the present disclosure is to apply an electric voltage bias between the magnetron anode and the pulse power driven magnetic field coil.

The invention includes an apparatus and method for facilitating the directing and focusing of magnetron produced ionized sputter material onto a substrate. As one aspect of the invention, a magnetic field coil (hereinafter also referred to as a field coil) is provided between a magnetron target where ionized sputter material is produced and a substrate where the ionized sputter material is to be deposited. The magnetron is powered by a pulsed high voltage power supply to produce pulsed sputter outputs having pulse widths of greater than 100 $\mu s$. The field coil can be powered by a separate power supply. Alternatively, the magnetic field coil can be powered together with the magnetron by the magnetron pulsed high voltage power supply.

As a further aspect of the disclosure, a coil bias voltage of about 5 Volts (V) or greater can be supplied between the magnetron anode and the magnetic field coil.

Yet another object of the present disclosure is to apply an electric voltage bias between the magnetron anode and the pulse power driven field coil.

DETAILED DESCRIPTION OF THE INVENTION

Figure 1:
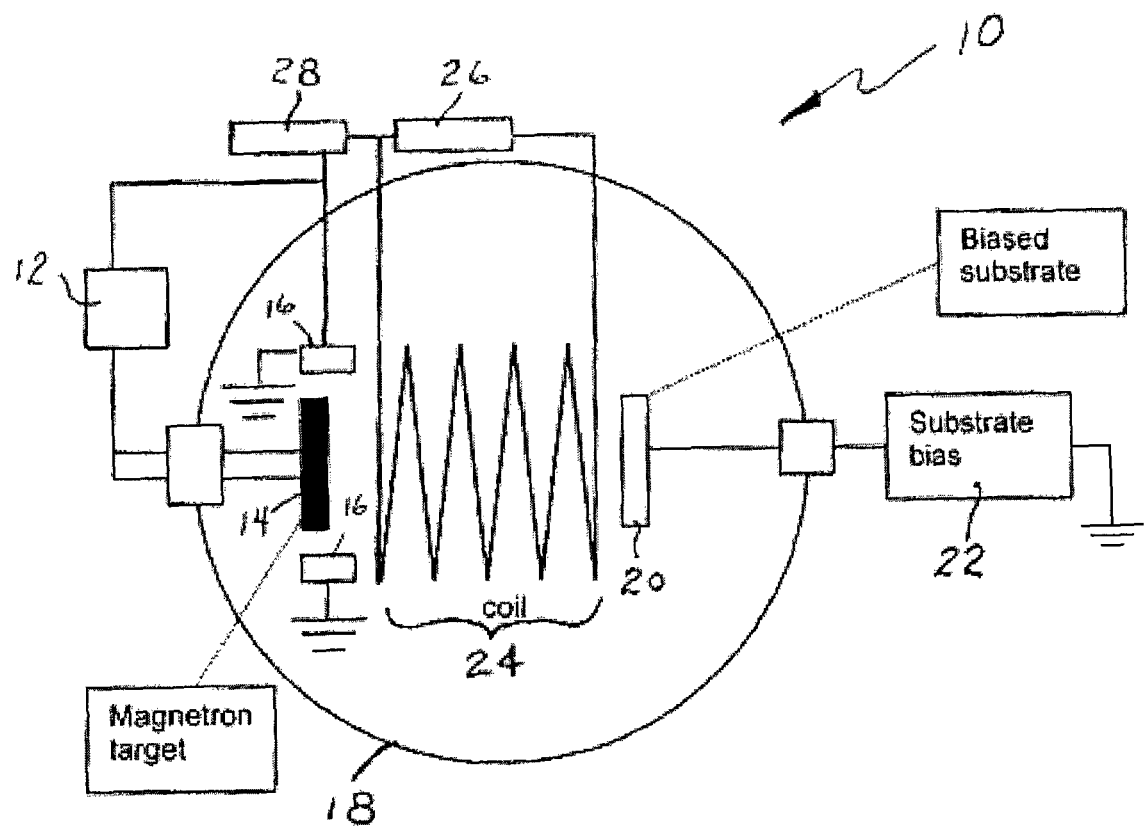
FIG. 1 is a sectional block drawing showing one aspect of the disclosure with a DC power supply driving a field coil that also has an applied electric bias voltage with respect to the field coil and a magnetron anode.

A first HIPIMS system for practicing the present disclosure is shown in FIG. 1 where the system is identified with the general reference number 10. This HIPIMS system 10 uses a pulsed magnetron high voltage power supply 12 to drive a magnetron including a magnetron target 14 and a grounded magnetron anode 16. The grounded magnetron anode 16 and magnetron target 14 are positioned in a vacuum chamber 18. The pulsed magnetron high voltage power supply 12 may be a specialized pulsed power supply capable of operating in a high power impulse magnetron sputtering mode. According to an embodiment, the pulsed magnetron high voltage power supply 12 is capable of delivering high voltage pulses (typically in the range of 600-1500 V) at a relatively high peak power. The absolute power depends on several factors including the area of the target. An approximate magnitude of the peak power necessary may be given as 1 $kW/cm^2$×the target area. For example, a target of 100 $cm^2$ might require a peak power of about 100 kW, the exact value being dependant on additional factors such as target material, target magnetic field strength, etc., the present calculation being presented for purposes of illustration only.

Included in the vacuum chamber 18 is a substrate 20. Sputtered material from the magnetron target 14 is supposed to be deposited on the substrate 20. A substrate bias voltage power supply 22 is connected to the substrate 20 to generate an electric field that is intended to direct and focus ionized sputter material onto substrate 20. The applied substrate bias voltage accordingly is adjusted to attract ionized sputter material to the substrate 20 in order to control the energy of the arriving ions, thereby affecting the surface and film properties in a desired way.

Positioned between the magnetron target 14 and the substrate 20 is a field coil 24. This field coil 24 is energized by a DC power supply 26. When energized by the DC power supply 26, the field coil 24 produces a static magnetic field to guide and focus ionized sputter vapor produced at the magnetron target 14 toward the substrate 20. The ionized sputter vapor is thus directed and focused onto the substrate 20.

According to the present disclosure, a coil bias power supply 28 also is provided. This coil bias power supply 28 energizes a bias potential between the magnetron anode 16 and the field coil 24. This applied electric field can be generated by applied voltages of 5 Volts or more. The electric field generated using the coil bias power supply 28 further assists the generated magnetic field to direct and focus ionized sputter vapors onto the substrate 20.

Figure 2:
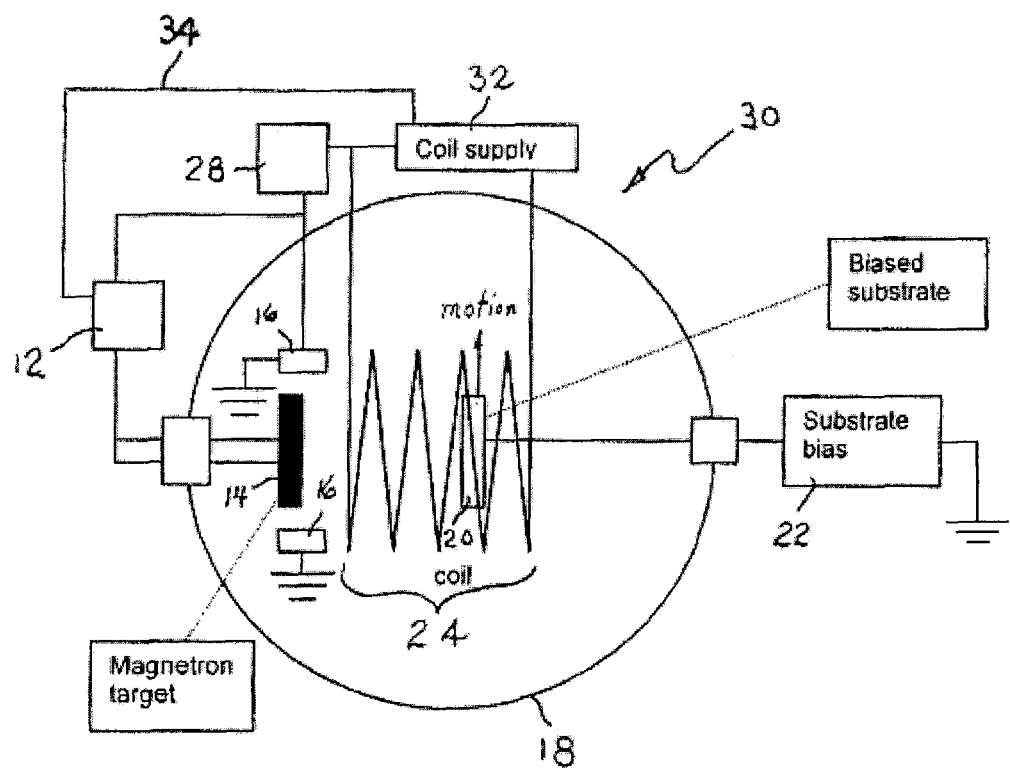
FIG. 2 is a sectional block drawing showing another aspect of the disclosure with separate power supplies for a magnetron and a field coil.

A second HIPIMS system for practicing another aspect of the present disclosure, shown in FIG. 2, is identified with the general reference number 30. Again, the pulsed magnetron high voltage power supply 12 is used to drive the magnetron including the magnetron target 14 and the grounded magnetron anode 16. The grounded magnetron anode 16 and magnetron target 14 are positioned in the vacuum chamber 18. Also included in the vacuum chamber 18 is the substrate 20. Sputtered material from the magnetron target 14 is to be deposited on the substrate 20. The substrate bias voltage power supply 22 is adjusted to produce an electric field to attract ionized sputter material to the substrate 20. Positioned between the magnetron target 14 and the substrate 20 is the field coil 24. As shown in FIG. 2, the substrate 20 is positioned into one end of the field coil 24. This arrangement of having the substrate 20 positioned into one end of the field coil 24 is discussed below.

According to the present disclosure, both the coil bias power supply 28 and a pulsed coil power supply 32 for the HIPIMS system 30 are provided. The coil bias power supply 28 energizes a bias potential between the magnetron anode 16 and the field coil 24. The applied electric field can be generated by applied voltages of 5 V or more. This electric field assists the generated magnetic field to direct and focus ionized sputter vapors onto the substrate 20.

The field coil 24 is further energized by the pulsed coil power supply 32 to generate pulsed magnetic fields. The purpose of the pulsed magnetic fields is to direct and focus ionized sputter vapor produced at the magnetron target 14 toward the substrate 20. To accomplish this directing and focusing it is necessary to synchronize the pulsing of the magnetron high voltage power supply 12 that produces ionized sputter vapor with the pulsing of the pulsed coil power supply 32. This synchronization is accomplished using a synchronization line 34. To avoid and overcome self-induction effects in the field coil 24 that would retard generation of magnetic fields, the pulsing of the magnetron high voltage power supply 12 and the pulsed coil power supply 32 are adjusted to pulse widths that are greater than 100 µs. With these synchronizations and pulse width adjustments, the magnetudes of pulse produced magnetic fields are significantly increased over those produced by DC systems. Therefore, ionized sputter vapor is much more effectively directed and focused onto the substrate 20.

Shown in FIG. 2 is an arrangement with the substrate 20 positioned inside field coil 24. With this arrangement, the substrate 20 is placed in the field coil 24 where generated magnetic field lines intersect the substrate 20 substantially perpendicularly. Such an arrangement enhances directing and focusing ionized sputter material onto the substrate 20.

As a further aspect of the invention, the substrate 20 can be physically moved perpendicular to magnetic field lines to enlarge the coating areas across the front surface of the substrate 20.

Figure 3:
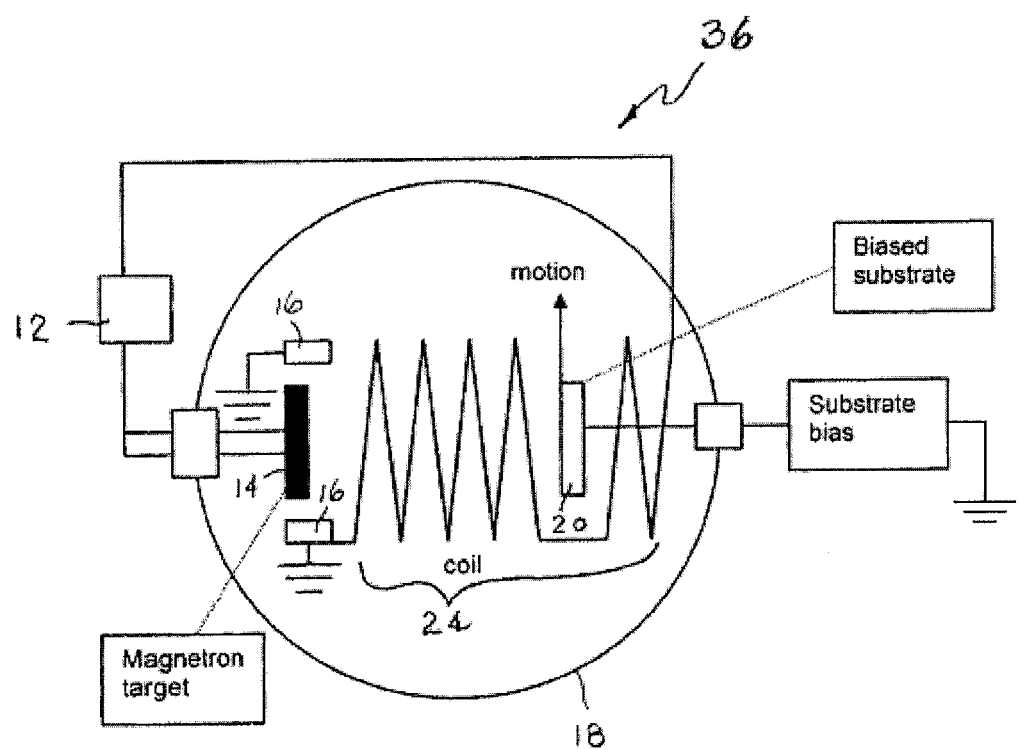
FIG. 3 is a sectional block drawing showing a further aspect of the disclosure with a common power supply to drive both a magnetron and a field coil.

A third HIPIMS system for practicing yet another aspect of the present disclosure is shown in FIG. 3 with the general reference number 36. Again the pulsed magnetron high voltage power supply 12 is used to drive a magnetron including the magnetron target 14 and the grounded magnetron anode 16. The grounded magnetron anode 16 and magnetron target 14 are positioned in the vacuum chamber 18. Also included in the vacuum chamber 18 is the substrate 20. Sputtered material from the magnetron target 14 is to be deposited on the substrate 20.

According to the present disclosure, the magnetron high voltage power supply 12 for HIPIMS system 36 energizes both the magnetron and field coil 24. Again to avoid and overcome self-induction effects in the field coil 24 the pulsing of the magnetron high voltage power supply 12 is adjusted to produce power pulse widths that are greater than 100 µs.

The field coil 24 in HIPIMS system 36 has one end connected to ground. This end connection can be made at the magnetron anode 16, as shown in FIG. 3. With this grounded end connection for the field coil 24 and the power connection from the pulsed magnetron high voltage power supply 12 to the field coil 24, a DC electric bias also is applied from the magnetron high voltage power supply 12 to field coil 24. Therefore, the HIPIMS system 36 shown in FIG. 3 uses the pulsed magnetron high voltage power supply 12 to provide power to the magnetron target 14 and anode 16 to generate ionized sputter material, and to the field coil 24 to produce both magnetic and electric fields to direct and focus ionized sputter material onto the substrate 20.

Figure 4:
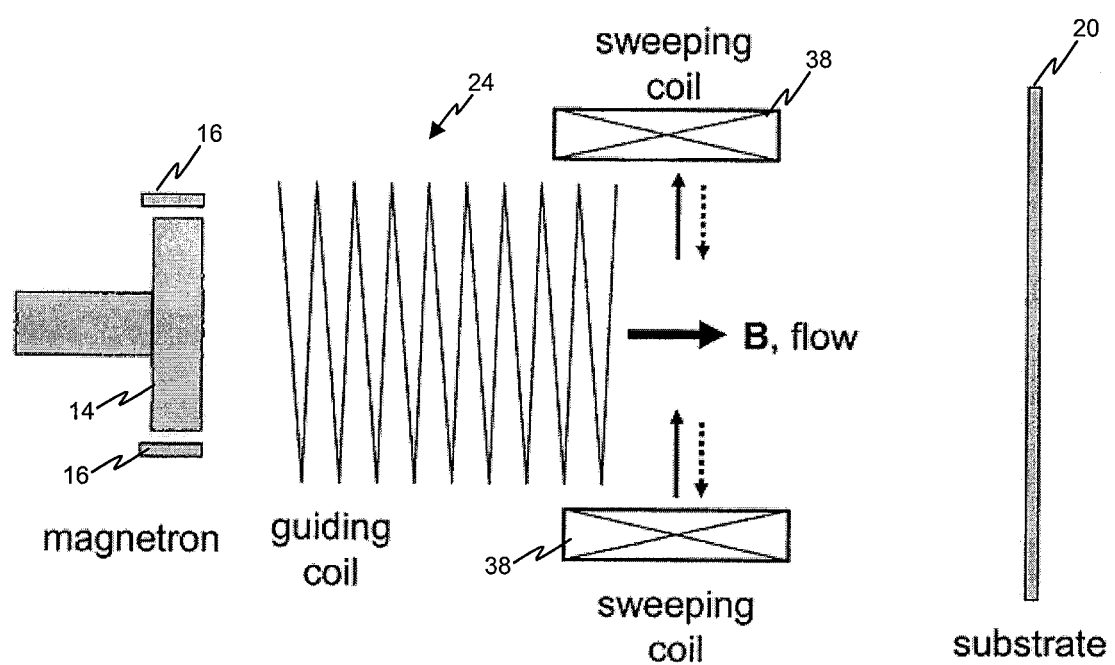
FIG. 4 is a sectional block drawing showing a further aspect of the disclosure with a pair of guiding coils to direct a plasma flow of ionized sputtered material exiting a field coil to cover a larger substrate area.

According to another aspect of the disclosure, a pair of sweeping or deflection coils may be used to direct ionized sputter vapor produced at the magnetron target 14 exiting the field coil 24. Referring to FIG. 4, as the ionized sputter vapor or "plasma" exits field coil 24, it does so in a substantially straight, axial manner. The center of the deposition onto the substrate 20 will be on the axis defined by the electric field between the grounded magnetron anode 16 and the substrate 20 biased by the substrate bias voltage power supply 22, and/or by the magnetic field of the field coil 24. The deposition rate will fall off with increasing distance off-axis. This falloff is due to the lower plasma density produced at such off-axis distance.

The embodiment depicted in FIG. 4 uses the tendency of a plasma flow to follow magnetic field lines. Thus, the present embodiment employs one or more pairs of deflection or sweeping coils 38 to urge or direct the plasma in a preferred off-axis direction by an additional transverse component of magnetic field. This direction can be controlled (e.g., reversed) by controlling (e.g., reversing) the current applied to and flowing in the sweeping coils 38. For example, one current direction might urge the plasma beam in the upward direction as shown by the solid arrows pointing from one sweeping coil 38 to a second sweeping coil 38 of a pair, as shown in FIG. 4, while reversing the current would urge or direct the plasma beam in the opposite downward direction, as shown by the dashed arrow. Use of at least two pairs of deflection coils (e.g., coil pairs configured at right angles to each other) provides an enlarged effective sputtering area onto substrate 20 using the sweeping coils 38 to guide the plasma and coat the substrate in the two dimensions substantially perpendicular to the field coil 24 and/or the electric field direction defined by the substrate bias voltage applied between the substrate 20 and the magnetron anode 16. This can be compared to a "paintbrush" principle of covering (e.g., "painting") a large area by sweeping (e.g., dithering) a relatively small beam in two dimensions lateral to the beam axis to cover a large area.

Although not shown, the sweeping coils 38 are connected to receive a controllable current so as to generate an appropriate magnetic field intensity and direction in the area between field coil 24 and substrate 20 so as provide a desired amount and direction of off-axis beam deflection. Note that this capability of using deflection or sweeping coils 38 to direct a plasma beam is based on the charged ion flow produced by a HIPIMS system that would not otherwise be possible in a conventional (i.e., non-HIPIMS) sputtering system.

While embodiments and application of this disclosure have been shown and described, it would be apparent to those skilled in the art having the benefit of this disclosure that many more modifications than mentioned above are possible without departing from the concepts disclosed herein. The disclosure, therefore, is not to be restricted except in the spirit of the appended claims.

What is claimed is:

1. A high power impulse magnetron sputtering apparatus comprising:
   a vacuum chamber;
   a magnetron target positioned in said vacuum chamber;
   a substrate positioned inside said vacuum chamber and away from said magnetron target;
   a magnetron anode positioned in said vacuum chamber, said anode being connected to an electrical ground;
   a field coil positioned between said magnetron target and said substrate and configured to generate a magnetic field when energized;
   a pulsed coil power supply connected to said field coil;
   a pulsed magnetron high voltage power supply connected to said magnetron target and said magnetron anode;
   a synchronization line connection between said pulsed magnetron high voltage power supply and said pulsed coil power supply;
   a substrate bias voltage power supply connected to said substrate and configured to generate an electric field to direct and focus ionized sputter material onto said substrate; and,
   a coil bias power supply connected to said field coil and to said magnetron anode and configured to apply an electric voltage bias to said field coil to assist the generated magnetic field to direct and focus ionized sputter vapors onto said substrate.

2. The apparatus according to claim 1 wherein the electric voltage bias is 5 volts or greater.

3. The apparatus according to claim 1 wherein said pulsed magnetron high voltage power supply and said pulsed coil power supply are configured to output power pulses having pulse widths greater than 100 microseconds.

4. The apparatus according to claim 1 wherein said substrate is positioned inside one end of said field coil.

5. The apparatus according to claim 1 wherein said field coil extends beyond said substrate with said substrate positioned inside said field coil.

6. The apparatus according to claim 1 wherein said coil bias power supply and said pulsed magnetron high voltage power supply are a single power supply.

7. The apparatus according to claim 1 further comprising a pair of deflection coils positioned between said field coil and said substrate, said deflection coils operable to direct said ionized sputter material in a direction substantially perpendicular to an ion direction caused by said electric field between said magnetron anode and said substrate.

8. A method for high power impulse magnetron sputtering comprising:
   providing a magnetron target positioned inside a vacuum chamber;
   providing a grounded magnetron anode inside said vacuum chamber;
   positioning a substrate inside said vacuum chamber and away from said magnetron target;
   positioning a field coil between said magnetron target and said substrate;
   providing a pulsed coil power supply that is connected to said field coil;
   providing a synchronization line connected to a pulsed magnetron high voltage power supply and connected to said pulsed coil power supply; and,
   providing an electric field between said field coil and said grounded magnetron anode to attract ionized sputter material from said magnetron target to said substrate.

9. The method according to claim 8 further comprising providing a coil bias power supply and to said grounded magnetron anode to provide the electric field.

10. The method according to claim 8 wherein the electric field is produced by a coil bias power supply providing 5 volts or greater.

11. The method according to claim 8 wherein said pulsed coil power supply and said pulsed magnetron high voltage power supply output pulses having pulse widths greater than 100 microseconds.

12. The method according to claim 8 wherein said substrate is positioned inside one end of said field coil.

13. The method according to claim 8 wherein said field coil extends beyond said substrate and said substrate is positioned inside of said field coil.

14. The method according to claim 10 wherein said coil bias power supply and said pulsed magnetron high voltage power supply are a single power supply.

15. The method according to claim 8 further comprising providing a magnetic field between said field coil and said substrate and selectively deflecting said ionized sputter material to cover a work area of said substrate.

16. A high power impulse magnetron sputtering apparatus comprising:
- a vacuum chamber;
- a magnetron including a magnetron target positioned in said vacuum chamber;
- a substrate positioned inside said vacuum chamber and away from said magnetron target;
- a field coil positioned between said magnetron target and said substrate;
- a pulsed power supply connected to said field coil and configured to produce a pulsed magnetic field between said magnetron target and said substrate;
- a high voltage power supply; and,
- a synchronization line connection between said high voltage power supply and said pulsed power supply.

17. The apparatus according to claim 16 further comprising a coil bias power supply connected to said field coil and configured to apply an electric voltage bias to said field coil to assist the pulsed magnetic field to direct and focus ionized sputter vapors onto said substrate.

18. The apparatus according to claim 16 wherein said pulsed power supply is a high voltage power supply.

19. The apparatus according to claim 18 wherein pulse widths of pulses output from said pulsed power supply are greater than 100 microseconds.

20. The apparatus according to claim 16 wherein said pulsed power supply outputs power pulses having pulse widths greater than 100 microseconds.

21. The apparatus according to claim 16 further comprising a pair of deflection coils operable to produce a controllable magnetic field between a magnetron anode and said substrate.

22. A method for high power impulse magnetron sputtering comprising:
- providing a magnetron target positioned inside a vacuum chamber;
- positioning a substrate inside said vacuum chamber and away from said magnetron target;
- positioning a field coil between said magnetron target and said substrate;
- using said field coil to produce a pulsed magnetic field to guide ionized sputter material from said magnetron target to said substrate;
- providing a pulsed coil power supply connected to said field coil to produce the pulsed magnetic field; and,
- providing a synchronization line interconnecting said pulsed coil power supply to a pulsed magnetron high voltage power supply to control when said pulsed power supplies output synchronized power pulses.

23. The method according to claim 22 further comprising providing a coil bias power supply connected to said field coil and a magnetron anode to apply an electric voltage bias to said field coil to produce an electric field to assist said pulsed magnetic field to direct and focus ionized sputter vapors onto said substrate.

24. The method according to claim 22 further comprising generating a magnetic field in a space between said field coil and said substrate.

* * * * *